United States Patent [19]

Lee

[11] Patent Number: 5,453,715
[45] Date of Patent: Sep. 26, 1995

[54] COMMUNICATION DEVICE WITH EFFICIENT MULTI-LEVEL DIGITAL DEMODULATOR

[75] Inventor: Edward K. B. Lee, Sunrise, Fla.

[73] Assignee: Motorola, Inc., Schaumburg, Ill.

[21] Appl. No.: 290,578

[22] Filed: Aug. 15, 1994

[51] Int. Cl.$^6$ .............................. H03D 3/00; H04L 27/14
[52] U.S. Cl. .................... 329/302; 375/324; 375/334
[58] Field of Search .......................... 329/300, 301, 329/302, 303; 375/44–51, 80, 82, 88–91

[56] References Cited

U.S. PATENT DOCUMENTS

| | | | |
|---|---|---|---|
| 3,846,708 | 11/1974 | Franco | 329/303 |
| 4,254,503 | 3/1981 | Vance | 375/91 |
| 4,605,903 | 8/1986 | Ihle | 375/80 X |
| 4,752,742 | 6/1988 | Akaiwa | 375/88 X |
| 5,090,026 | 2/1992 | Stern et al. | 329/300 X |
| 5,105,444 | 4/1992 | Gard | 329/300 X |
| 5,111,152 | 5/1992 | Makino | 329/300 |
| 5,121,412 | 6/1992 | Borth | 332/104 X |
| 5,243,299 | 9/1993 | Marchetto et al. | 329/300 |
| 5,339,333 | 8/1994 | Zehngut et al. | 329/301 X |

OTHER PUBLICATIONS

IEEE Transactions on Communication Technology, vol. Com–18, No. 2, Apr. 1970, pp. 110–118 "An FM Detector For Low S/N" by John H. Park, Jr.

*Primary Examiner*—David Mis
*Attorney, Agent, or Firm*—M. Mansour Ghomeshi

[57] ABSTRACT

A communication device (100) includes mixers (104) and (108) which mix a local oscillator (112, 106) with a received signal to produce in-phase (i) and quadrature (q) components. The direction of the phase of the signal is detected at the i and q zero crossings. Next, the speed with which the phase rotation angle travels from one zero crossing to another is monitored via a controller (126). The controller (126) manipulates the speed and the direction of the phase rotation angle in order to establish the contents of the received information signal.

16 Claims, 4 Drawing Sheets

5,453,715

COMMUNICATION DEVICE WITH EFFICIENT MULTI-LEVEL DIGITAL DEMODULATOR

TECHNICAL FIELD

This invention is generally related to communication devices and more particularly to digital communication devices.

BACKGROUND

Many demodulators used in digital communication devices use zero-crossings to determine the polarity of the demodulated signal. In zero IF (Intermediate Frequency) applications, signal phase information can be extracted from the zero crossings of the in-phase and quadrature signals. These zero-crossings are detected by an appropriate circuitry to demodulate the carrier signal and reconstruct the originally transmitted information signal.

In general, digital signals may be demodulated in various ways. In U.S. Pat. No. 4,322,851 issued on Mar., 30, 1982, Ian Vance teaches a method of demodulating a binary FSK signal. This technique uses the direction of the phase rotation angle to detect signal polarity. A significant problem with this approach is its inability to demodulate multi-level digital signals.

To overcome this limitation, a Cross-Differentiate-Multiply (CDM) demodulation technique may be employed. This technique is detailed in an article titled "An FM Detector for low S/N" written by John Park and published in IEEE T-Comm, Vol. com-18, No. 2, April 1970. This technique is highly complicated and requires two differentiators, four multipliers, one divider and two summers. The number of devices, hence their current drain, used to realize this technique is prohibitive particularly in battery operated portable communication applications.

Yet another approach employs the $\tan^{-1}$ (inverse tangent) operation $\{[q(t)]/[i(t)]\}$ with digitized i and q signals. This technique requires two Analog to digital converters and a processor. Once again the current drain is prohibitive, particularly in portable applications.

A demodulation technique is therefore desired that could efficiently demodulate multi-level digital signals.

DETAILED DESCRIPTION OF THE PREFERRED EMBODIMENT

Some digital FSK demodulation schemes estimate transmitted data by estimating a phase rotation direction at zero-crossing points. The performance of such demodulation schemes varies with the number of zero crossing points. An increase in the number of measurements of a phase rotation direction at zero-crossing points improves the performance of the demodulator, and increases the maximum transmit bit rate at a given frequency deviation. A U.S. application Ser. No. 08/290,161 titled "COMMUNICATION DEVICE WITH EFFICIENT ZERO-CROSSING GENERATOR" having attorney docket CM01679J and filed concurrently herewith describes a method for increasing the number of zero crossings.

In general, a received signal is converted to zero IF either directly or via multiple conversion stages. Traditionally, the conversion is accomplished via two mixers which produce the in-phase (i) and the quadrature phase (q) signal. The i and q signals are used in the recovery of the transmitted information signal. One technique determines the polarity of the bit by estimating the phase rotation direction. A phase rotation direction may be determined by sampling q waveforms at i zero crossings and i waveforms at q zero-crossing points. Estimating the phase rotation direction in demodulating digital signals is limited to binary applications. The present invention proposes the use of i and q components to demodulate even multi-level digitally modulated signals. In addition to the direction of the phase at zero crossings, the present invention uses the speed of phase rotation angles to estimate the contents of the M-ary signals.

Figure 1:
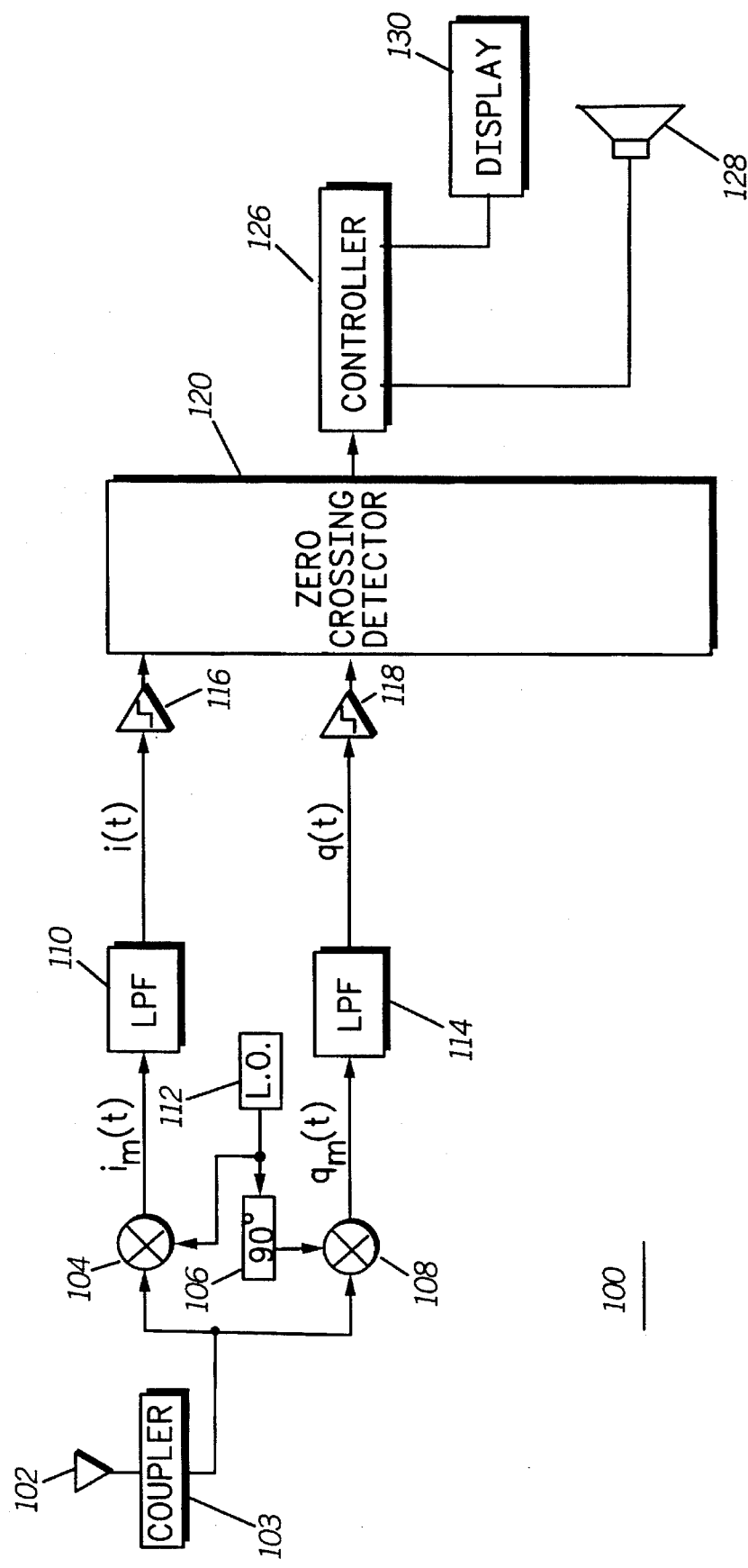
FIG. 1 shows a block diagram of a communication device in accordance with the present invention.

To better understand the principles of the present invention reference is made to the drawings and in particular to FIG. 1. This figure shows relevant portions of a communication device 100 having a multi-level FSK (Frequency Shift Keying) demodulator. A radio frequency signal, received at the antenna 102 is converted to zero IF via two mixers 104 and 108. Those skilled in the art appreciate that an intermediate conversion stage may be employed before the Zero IF signal is generated. This optional intermediate conversion stage is shown by a coupler 103. An oscillator 112 provides the local oscillator (LOA) signal for 104. The local oscillator signal for the mixer 108 is supplied through a 90° phase shifter 106. The output signals of the mixers 104 and 108 are filtered at LPFs 110 and 114 to produce the i and q signals. These signals are limited at limiters 116 and 118 before being applied to a zero crossing detector 120. The detector 120 detects zero crossings using for instance a flip flop with an edge triggered clock input. The detected zero crossings are applied to a controller 126 for further analysis and decoding. The controller 126 proceeds to decode the received signal by measuring the speed of the phase rotation angle between zero crossing. This information is used to reconstruct the information signal. The audio portion and the data portion of the information signal is then coupled to a speaker 128 and a display 130, respectively. The operation of the controller will be described with the help of the flow chart of FIG. 3.

Figure 3:
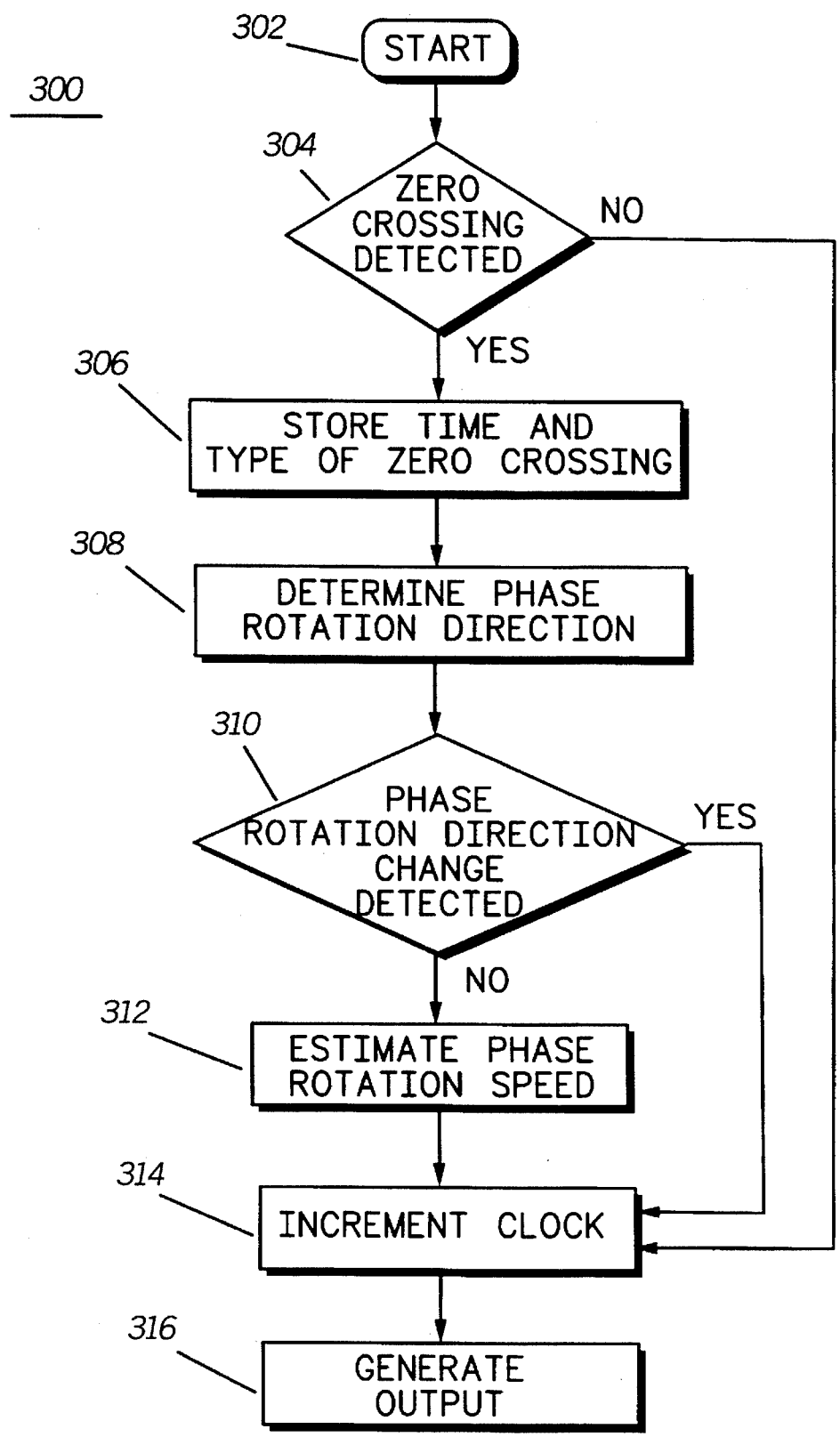
FIG. 3 shows a flow chart of the operation of a communication device in accordance with the present invention.
Figure 4:
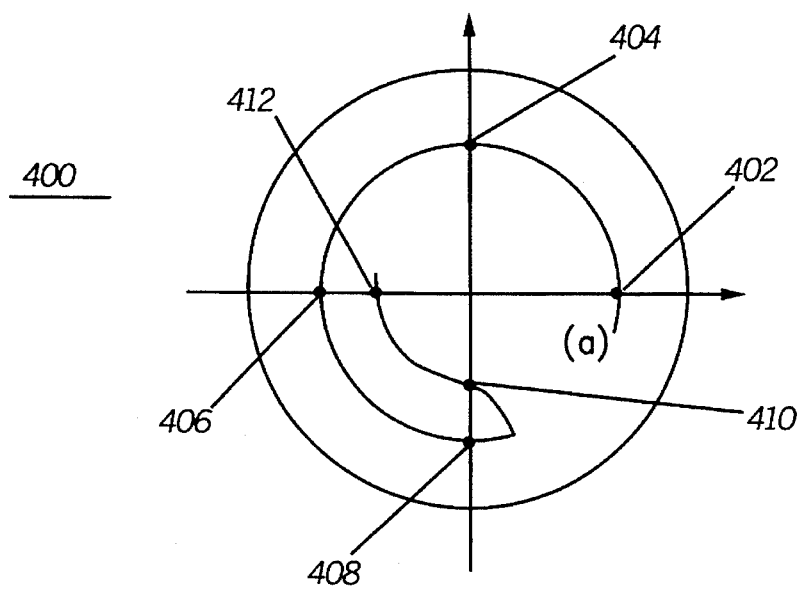
FIG. 4 shows a phase vector diagram depicting the phase rotation direction and zero crossings in accordance with the present invention.

Referring to FIG. 3, a flow chart 300 representing the flow of the operation of the controller 126 in accordance with the present invention is shown. From a start block 302 the controller 126 determines if zero crossings have been detected by the detector 120, block 304. Upon detection, the YES output, the time and type of the zero crossing is stored, block 306. The type of zero crossing as used in this step refers to information on whether an i or a q zero crossing was detected. In addition, the direction of the i or q zero crossing in the time domain is included in the type of zero crossing as it is stored in the memory. The direction of the phase rotation (positive or negative) is determined using a sequencing scheme.

In the preferred embodiment, the detector 120 detects zero crossings of the i and q waveforms. These detected zero crossings are then coupled to the controller 126. When the i waveform goes from positive to negative, the detector 120 detects an i positive zero crossing. Similarly, when the i waveform goes from negative to positive, the detector 120 detects an i negative zero crossing. The controller 126 receives this information and determines the direction and the speed of the phase rotation.

Continuing with the flow chart 300, the direction of the phase rotation angle is determined via block 308 followed by the detection of any phase rotation direction changes, block 310. The detection of the direction of the phase rotation angle is accomplished through a sequencing scheme which monitors the sequence of the i and q zero crossing types. As an example of the sequencing scheme, the q positive zero crossing following an i positive zero crossing indicates positive phase rotation. Similarly, an i positive zero crossing following a q positive zero crossing indicates negative phase rotation. In short, the sequence and the polarity of zero crossings determine the direction of the phase rotation. The No output results in the estimation of the phase rotation speed, block 312. The speed of the phase rotation is estimated by measuring time taken between zero-crossings. The more time it takes, the slower the phase rotates. Hence, the phase rotation speed is inversely proportional to an interval time between zero-crossings. The zero-crossing time interval measurements are implemented by counting the number of sample clock ticks which runs much faster than the maximum zero-crossing frequencies. This technique, measuring time between zero-crossings, may be viewed as an approximation to a Cross-Differentiate-Multiply (CDM) operation. To combat click problems that may be present in FSK systems in the presence of noise, the demodulated output may be clipped.

Once the speed has been estimated, the clock is incremented, block 314. This clock is maintained internally by the controller 126 and is used for measuring the time between zero crossings. This clock provides the controller 126 with the timing information it needs to estimate the speed of the phase rotation angle. The NO output of the decision block 304 and the YES output of the decision block 310 both result in the clock being incremented, block 314. At this point the controller 126 generates the output based on the measured speed.

Figure 5:
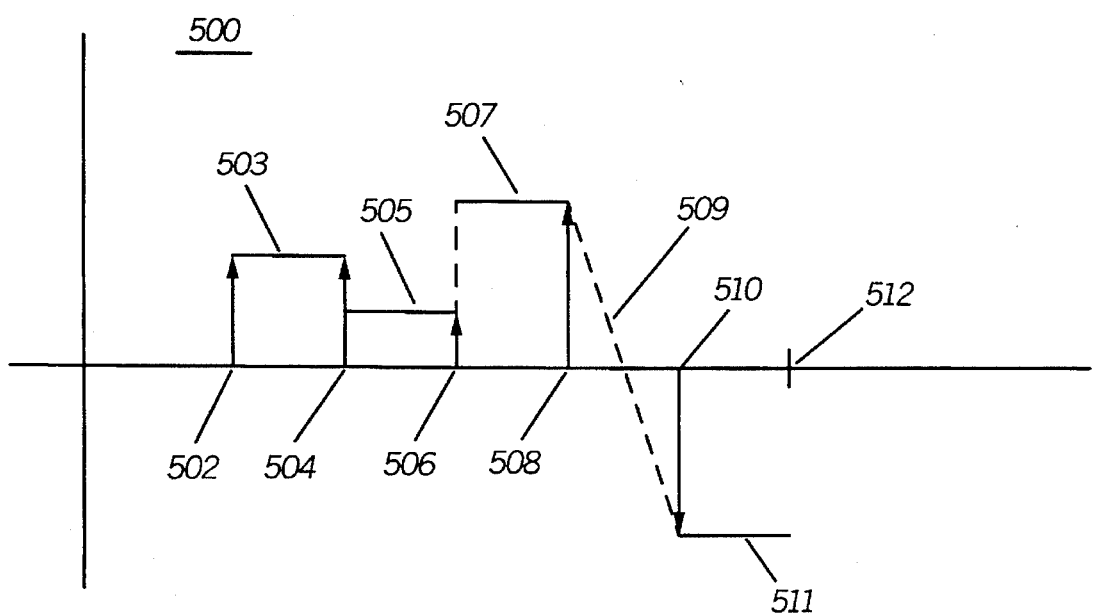
FIG. 5 shows the speed representation of the phase rotation diagram of FIG. 4.

To better understand the principles of the present invention concurrent reference is made to the phase diagram 400 and its time equivalent speed estimation curve 500 of FIG. 5. In these diagrams, the phase rotation from an arbitrary position (a) is traced. The parenthetical designators refer to the equivalent timing marks on diagram 500. A zero crossing in the positive rotation is shown by 402 (502). A second positive zero crossing 404 (504) is encountered at the q axis. The phase diagram continues with a third zero crossing 406 (506). A forth crossing occurs at 408 (508). After the forth zero-crossing, the phase rotation makes a directional change and starts a clockwise rotation. A negative zero crossing is encountered at the q axis 410 (510). As can be seen the negative zero crossing is shown by a negative vector on the diagram 500. This is intended to facilitate the understanding of the difference between a positive and negative phase rotation angle. This difference is later captured by the mechanism to estimate the speed of the phase rotation. Next, there is one additional negative (clockwise) zero crossing 412 (512). The controller 126 uses information on these zero crossings to determine the speed of the phase rotation. With the knowledge of the speed, the controller 126 can proceed to decode the contents of the information signal.

In the preferred embodiment, the controller 126 monitors the amount of time the phase rotation travels from a first zero crossing to a second zero crossing in order to produce a measured time. The controller 126 knows of the phase angle between two zero crossings from the number of i and q signals. With this knowledge, the speed of rotation can be estimated by dividing the phase angle between the first and second zero crossings by the measured time.

Continuing with this example, the controller 126 monitors the speed of the phase rotation at zero crossings and tracks them as shown in the speed estimation curve 500. The connecting lines 503,505,507, and 511 represent the speed with which the phase rotation travels from one zero crossing to another. For example, the speed with which the phase rotates from the zero crossing 402 to the zero crossing 404 is estimated to be 503. It is significant to note that the determination of the speed is made at zero crossing 404.

As stated, the phase rotation angle makes a directional change after crossing 408. Since it is not known how far the phase continues in the forth quadrant, the controller 126 can not exactly determine the distance which the phase rotation travels before the directional change occurs. Unable to establish distance, the controller can not calculate the speed based on the consumed time. Consequently, an estimate of the speed must made. In the preferred embodiment, a diagonal line 509 is made from the point 508 to the point 510. This diagonal line 509 makes an estimate of the speed of travel for situations where a change in direction is detected.

To estimate the contents of the multi-level information signal, the controller 126 proceeds to manipulate the informatin on the direction of the phase rotation at zero crossings with the estimated speed. In the preferred embodiment, the controller 126 combines the two peices of information in order to produce a combined signal. The contents of the information signal is then extrapolated from the combined signal at the controller 126.

To minimize the effects of noise on the phase speed estimation curve 500 and to extrapolate the contents of the information signal a post processing step, e.g. filtering, may be desired. In the preferred embodiment, a Low Pass Filter (LPF) realized digitally by the controller 126 is used to convert the curve 500 into a smooth time varying signal which represents the speed of the phase rotation angle. Other post processing techniques such as clipping may be employed in addition to or in place of the filtering step.

In an M-ary system a decision table that converts the phase rotation speed to a digital value is referred to in order to determine the digital value of the received signal. Due to the presence of noise, this decision table includes ranges for each detected symbol. The following table provides an example:

| | |
|---|---|
| 1 | 0° to +180° (divided by one symbol time) |
| 2 | 0° to −180° (divided by one symbol time) |
| 3 | >+180° (divided by one symbol time) |
| 4 | <−180° (divided by one symbol time) |

It is noted that the division of the phase distance by one symbol time produces the speed of travel of the phase rotation angle. For the purpose of illustration it is assumed that the controller 126 detects a 270° over a symbol time. Using this exemplary chart, the controller 126 concludes that a "10" was transmitted.

A significant benefit of the present invention over the prior art is immediately noticed here. The proposed system is capable of demodulating multi-level digital signals and is not limited just to binary. Demodulation of multi-level signals is now efficiently possible since the present invention provides for both the detection of the direction of the phase rotation angle and the speed of the phase rotation at zero crossings. Indeed, there is no limit to the level of the signal being detected.

It is noted that although the preferred embodiment utilizes rotation angles over a symbol time greater than 90°, it is readily feasible to accommodate signals that have less than 90° phase rotation angle over a symbol time. An example of one such system is a four level continuos FSK system where the phase rotation angle over a symbol time is often less than 90°. In this case, more zero crossings may be generated using summers and subtractors at the output of the mixers 104 and 108. These components combine the mixer outputs to produce additional signals 45° and 135° away from the I signal. Such a scheme provides for two additional phase axes thereby increasing the number of zero crossings by a factor of two. This alternative embodiment is shown in FIG. 2.

Figure 2:
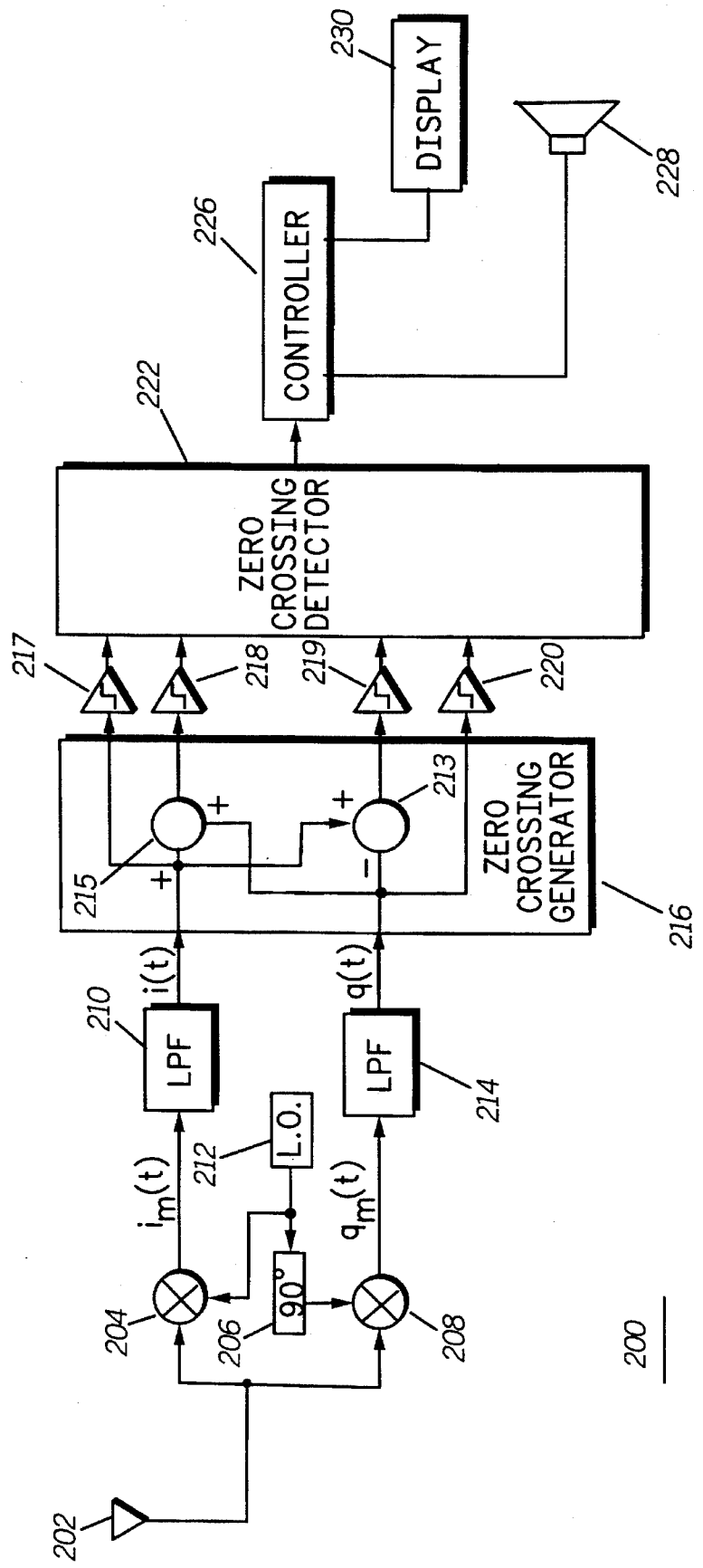
FIG. 2 shows a block diagram of an alternative embodiment of the present invention.

Referring to FIG. 2, a received signal is coupled from an antenna 202 to a pair of mixers 204 and 208. A local oscillator 212 provides local oscillator signal for 204 and 208 directly and through a phase shifter 206, respectively. Low pass filters 210 and 214 remove high frequency components from the mixed outputs to produce the first in-phase and quadrature components i and q, respectively. These two signals are then coupled to an efficient zero-crossing generator 216. This generator 216 manipulates the i and q signals to generate additional zero crossings. In the preferred embodiment, the manipulating of the i and q signals includes adding and subtracting them in a summer 215 and subtractor 213, respectively. The function of adding and subtracting the i and q channels result in two new in-phase and quadrature signals 45° and 135° away from the i channel. This finding may be mathematically proven as follows.

In general, a received RF signal coupled from the antenna 102 is mixed with $\cos(w_c t)$ and $-\sin(w_c t)$ to generate i and q signals at the outputs of mixers 104 and 108, respectively. When the received RF signal is represented as $\cos(w_c t + q(t))$, the mixing operation may be mathematically described as:

$$i_m(t) = \cos(w_c t + q(t))\cos(w_c t) \quad (1)$$
$$= \frac{1}{2}[\cos(2w_c t + q(t)) + \cos(q(t))]$$

This signal is filtered via filters 110 and 114. The filtered signals are represented as:

$$i(t) = \cos(q(t)) \quad (2)$$

$$q(t) = \cos(q((t)-90°)) \quad (3)$$

$$= \sin(q(t)) \quad (4)$$

The filtered signals are applied to limiters 217 and 219 before being coupled to a zero-crossing detector 222. These limiters provide zero crossing information on the i and q channels. The filtered signals are added and subtracted at 215 and 213, respectively to produce:

$$i_1(t) = \cos(q(t)-45°) \quad (5)$$

$$q_1(t) = \cos(q((t)-135°)) \quad (6)$$

$$= \sin(q(t)-45°) \quad (7)$$

Note that the creation of these two additional components $i_1$ and $q_1$ is accomplished without any additional mixers, phase splitters, or low pass filters.

The generation of $i_1(t)$ and $q_1(t)$ may be mathematically explained using the following trigonometric equation.

$$\cos\alpha + \cos\beta = 2\cos\left(\left(\frac{1}{2}\right)(\alpha-\beta)\right)\cos\left(\left(\frac{1}{2}\right)(\alpha+\beta)\right) \quad (8)$$

Using this relationship, $i_1(t)$ may be expressed as:

$$i_1(t)=(\cos((\theta(t)))+\cos(\theta(t)-90°)) \quad (9)$$

Equation 9, may be expressed in terms of i(t) and q(t) using Equations 2 and 3:

$$i_1(t)=(i(t)+q(t)) \quad (10)$$

Similarly, $q_1$ may be generated using the following equation:

$$q_1(t)=(-i(t)+q(t)) \quad (11)$$

Equations 10 and 11 indicate that $i_1(t)$ and $q_1(t)$ may be generated by summing and subtracting i(t) and q(t). It is noted that the output of the adder 215 and subtractor 213 produce unscaled signals. This result is produced since the i and q signals are added in the form of vectors. This function could simply be accomplished via appropriate amplification and/or attenuation in the summer 215 and subtractor 213.

The second in-phase $i_1(t)$ and quadrature $q_1(t)$ components result in additional zero crossings. The outputs of the summer 215 and the subtractor 213 are coupled to the zero-crossing detector 222 via limiters 218 and 219, respectively. These limiters work in conjunction with limiters and 220 to provide the detector 222 with a total of four phase signals which are used to detect additional zero crossings therein. The detection of zero crossings may be accomplished via D flip flops having an edge triggered clock input.

A benefit of generating additional zero crossings using the zero crossing generator 216 is the elimination of additional mixers, phase shifters and filters as suggested by the prior art. The elimination of these additional components results in significant current savings which is highly desired in portable communication devices. The summer 215 and the subtractor 213 which provide the additional in-phase and quadrature components are traditionally low current consuming devices as compared to mixers. The detected zero crossings are used by the controller 226 to determine the content of the information signal. The controller 226 proceeds to present the information to a speaker 228, display 230 or otherwise use or process in accordance with its contents.

In summary, a mechanism has been described whereby a multi-level digital signal could be demodulated using zero crossings of i and q signals. A detector detects zero crossings by monitoring the phase rotation angle. The phase rotation angle is then monitored at each zero crossings for phase direction. A controller keeps track of the speeds with which the phase rotation angle travels from one zero crossing to another. These speeds are combined with corresponding direction of the phase rotation angle in order to estimate the signal. The significance of this method is that it requires significantly fewer components to realize the same conclusions. It is no longer necessary to use analog to digital converters, multipliers, or differentiators. A simple counter and a zero crossing detector is all that is needed to accomplish this task.

What is claimed is:

1. In a communication device having a zero IF (Intermediate Frequency) receiver for receiving a radio frequency signal modulated by an information signal having a phase rotation, a method for demodulating a multi-level signal comprising the steps of:

generating an IF signal having in-phase and quadrature signals;

monitoring the phase rotation in order to detect zero crossings of the in-phase and quadrature signals;

sensing the direction of the phase rotation;

estimating the phase rotation speed with which the signal travels from a first zero crossing point to a second zero crossing point in order to produce an estimated phase rotation speed; and estimating the contents of the information signal using the phase rotation speed and the direction of the phase rotation.

2. The method of claim 1, further including a step of post processing the estimated phase rotation speed.

3. The method of claim 2, wherein the step of post processing includes filtering the estimated phase rotation speed.

4. The method of claim 1, wherein the step of estimating the contents of the information signal includes the step of manipulating the estimated speed and the direction of the phase rotation.

5. The method of claim 1, wherein the step of estimating the phase rotation speed includes the step of measuring the time the phase rotation takes to travel from the first zero crossing to the second zero crossing in order to produce a measured time.

6. The method of claim 5, wherein the step of estimating the phase rotation speed includes the step of dividing the phase angle between first and second zero crossings by the measured time.

7. In a communication device having a zero IF receiver for receiving a radio frequency signal, a method for demodulating a multi-level signal comprising the steps of:

generating an IF signal having in-phase and quadrature signals;

monitoring the phase rotation in order to detect zero crossings of the in-phase and quadrature signals;

sensing the direction of the phase rotation;

measuring the time the signal takes to travel from a first zero crossing to a second zero crossing to produce a measured time; and estimating the contents of the multi-level signal by manipulating the measured time and the direction of the phase rotation.

8. The method of claim 7, wherein the step of estimating includes calculating the speed with which the phase rotation travels from one zero crossing to another to produce a phase speed estimation curve.

9. The method of claim 8, further including a step of post processing the phase speed estimation curve.

10. A communication device for receiving an information signal, comprising:

a first mixer for producing a first in-phase component;

a second mixer for producing a first quadrature phase component;

a multi-level detector for detecting the contents of the information signal using the in-phase and quadrature components, the detector comprising:

means for detecting the direction of phase rotation at zero crossings;

means for estimating the speed of the signal as it travels from a first zero crossing to a second zero crossing to produce an estimated speed;

means for combining the speed and the phase rotation to produce a combined signal; and means for extrapolating the contents of the information signal using the combined signal.

11. The communication device of claim 10, further including means for post processing the estimated speed.

12. The communication device of claim 11, wherein the means for post processing includes a low pass filter.

13. The communication device of claim 10, further including means for manipulating the first in-phase and quadrature components to produce additional zero crossings by generating at least a second in-phase component and a second quadrature phase component.

14. The communication device of claim 13, wherein the means for detecting includes a detector for detecting the direction of phase rotation at zero crossings using the second in-phase and quadrature components.

15. The communication device of claim 10, wherein the means for combining includes a controller.

16. The communication device of claim 10, wherein the means for extrapolating includes a controller.

* * * * *